United States Patent [19]

Yamashita

[11] Patent Number: 5,438,480
[45] Date of Patent: Aug. 1, 1995

[54] PRINTED CIRCUIT BOARD AND ELECTRONIC PARTS TO BE MOUNTED THEREON

[75] Inventor: Masayasu Yamashita, Shimizu, Japan

[73] Assignee: Koito Manufacturing Co., Ltd., Tokyo, Japan

[21] Appl. No.: 151,103

[22] Filed: Nov. 12, 1993

[30] Foreign Application Priority Data

Nov. 13, 1992 [JP] Japan .............................. 4-084332 U

[51] Int. Cl.⁶ ........................ H05K 7/02; H01L 23/28
[52] U.S. Cl. .................................. 361/760; 174/52.2; 174/260; 361/736; 361/752; 257/687; 257/787
[58] Field of Search ................. 29/841, 848, 855, 856, 29/883, 858; 174/52.2, 260–262, 263; 361/760–764, 736, 748, 752; 257/787, 687

[56] References Cited

U.S. PATENT DOCUMENTS

| | | |
|---|---|---|
| 3,239,596 | 3/1966 | Henderson . |
| 3,271,638 | 9/1966 | Murad . |
| 3,340,438 | 9/1967 | Dion et al. . |
| 3,412,788 | 11/1968 | Pomerantz . |
| 3,689,804 | 9/1972 | Ishihama et al. .................... 174/52.2 |
| 4,375,008 | 2/1983 | Dathe ................................. 174/52.2 |
| 4,982,376 | 1/1991 | Megens et al. ....................... 174/263 |
| 5,228,766 | 7/1993 | Makita et al. ........................ 362/61 |

*Primary Examiner*—Bot L. Ledynh
*Attorney, Agent, or Firm*—Sughrue, Mion, Zinn, Macpeak & Seas

[57] ABSTRACT

Disclosed are a printed circuit board which buries the leads of electronic parts mounted on a printed board into a coating material to prevent the occurrence of a leak between the leads, and an electronic part designed to suppress the occurrence of cracks in a coating layer formed by coating a coating material on the electronic part and a printed board after the former is mounted on the latter. The printed circuit board comprises a printed board, a frame provided on the soldering-surface side of the printed board to surround all or a part of the soldering surface of the printed board in such a way that the amount of protrusion of the frame from the soldering surface of the printed board is made larger than that of protrusion of the leads of the electronic parts from the soldering surface side of the printed board, and a coating material injected inside the frame to bury the leads that protrude from the printed board. The electronic part comprises a case body having side walls nearly perpendicular to the mount surface of the electronic part. The electronic part has a mount surface at which the electronic part is to be attached to the printed board when mounted thereon. The mount-surface side outer peripheral portions of the side walls of the case body are each formed to have a curved surface so that as the outer peripheral portions approach the mount surface, the outer peripheral portions extend further outward.

8 Claims, 12 Drawing Sheets

PRINTED CIRCUIT BOARD AND ELECTRONIC PARTS TO BE MOUNTED THEREON

BACKGROUND OF THE INVENTION

1. Field of the Invention

The present invention relates to a printed circuit board on which electronic parts with leads are mounted and their soldering surfaces are coated with a coating material, and an electronic part having a plurality of leads protruding from its case body. More particularly, this invention relates to a printed circuit board with electronic parts mounted thereon, whose leads and soldered portions are buried in a coating material to prevent the occurrence of a leak between the leads and the solder lands, and an electronic part designed to suppress the occurrence of cracks in a coating layer formed by coating a coating material on the electronic part and a printed board after the electronic part is mounted thereon.

2. Description of the Related Art

It is necessary to provide waterproofing and dampproofing measures to electronic parts which are used under extreme environmental changes, such as electrical equipments for a vehicle.

Figure 12:
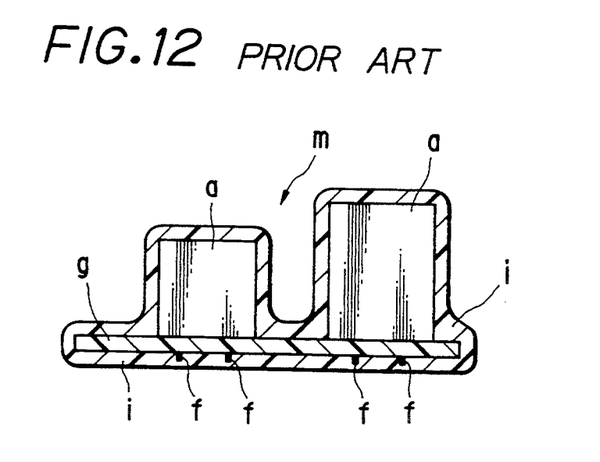
FIGS. 12 through 14 exemplify a conventional printed circuit board, FIG. 12 being a cross-sectional view, FIG. 13 an enlarged cross-sectional view showing essential portion, FIG. 14 an enlarged cross-sectional view showing where a conventional drawback lies.
Figure 13:
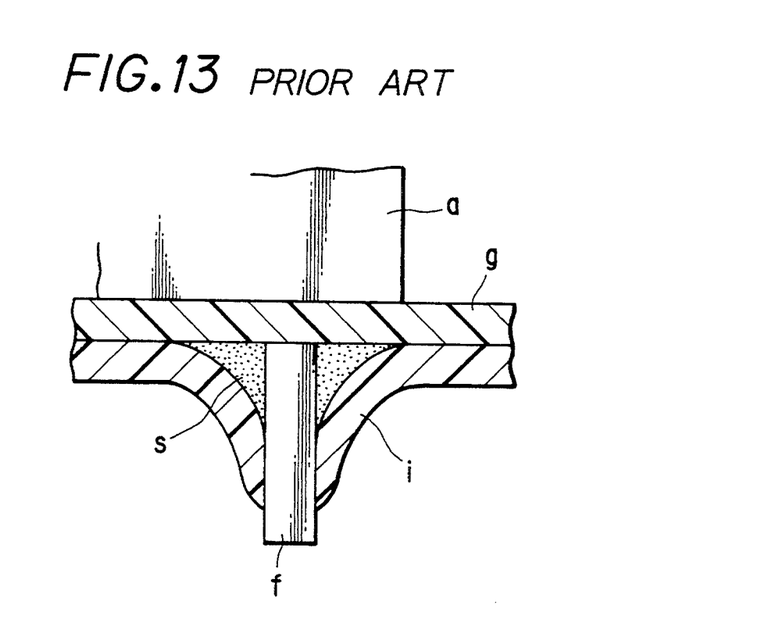
Figure 14:
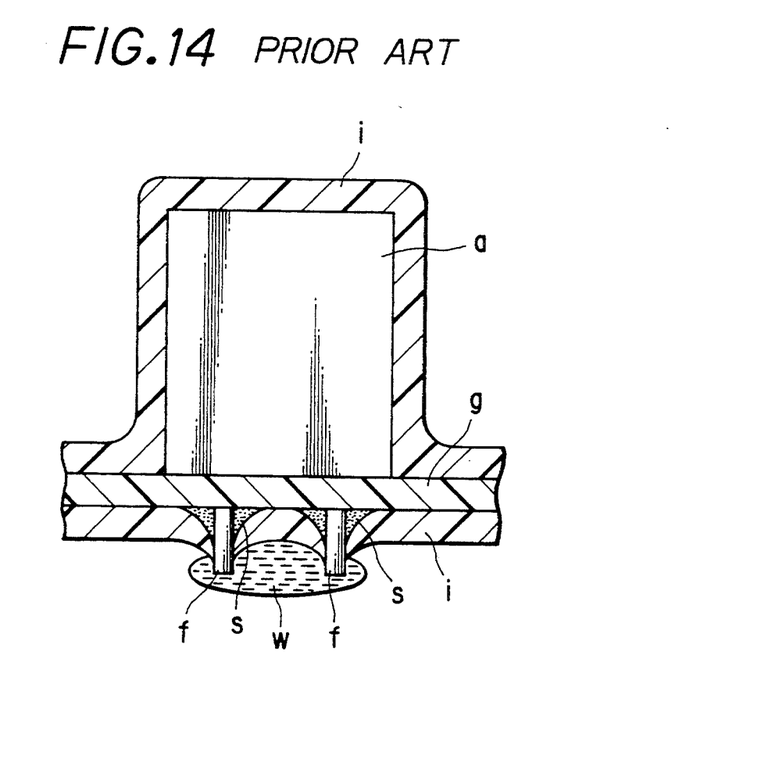
Figure 15:
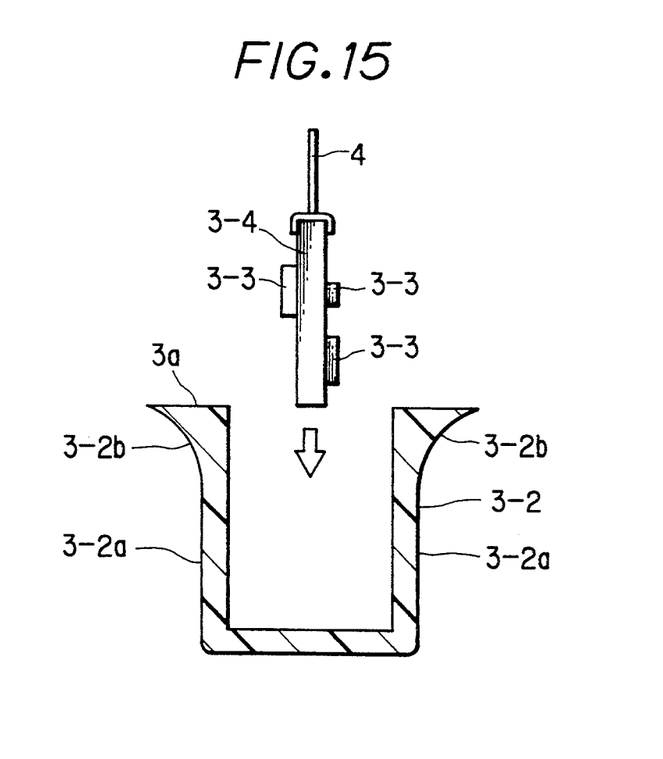
FIG. 15 is a cross-sectional view showing a case body and electronic elements.
Figure 16:
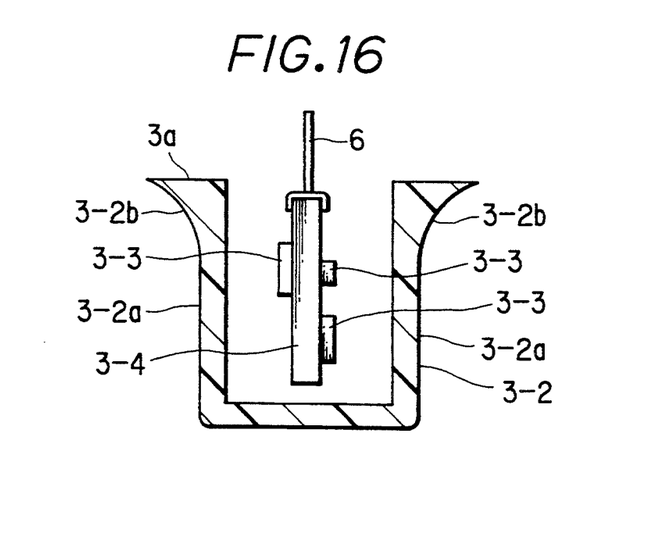
FIG. 16 is a cross-sectional view showing the electronic elements inserted into the case body.
Figure 17:
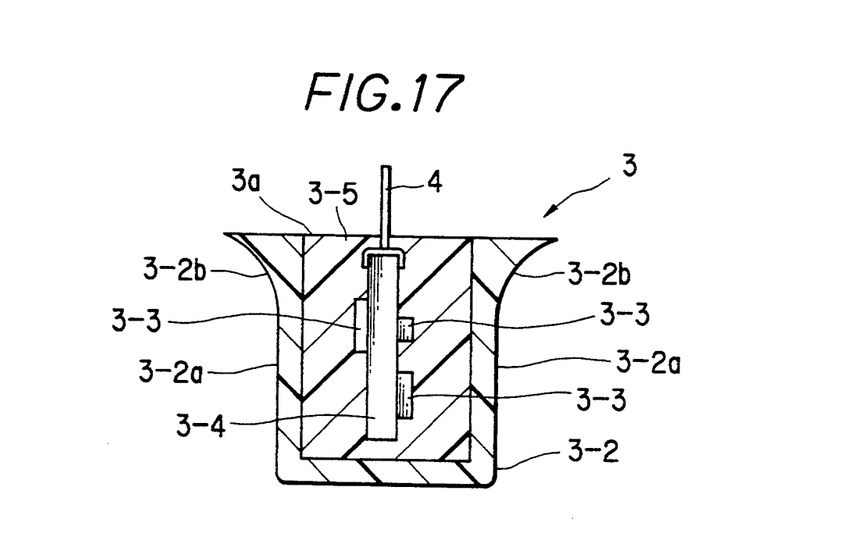
FIG. 17 is a cross-sectional view showing a resin material injected into the case body.

FIGS. 12 through 14 illustrate a conventional waterproof and dampproof printed circuit board m. Electronic parts a are mounted on a printed board g by inserting their leads f through the land holes (not shown) formed in the printed board g and then soldering those portions of the leads f which protrude from the soldering surface side of the printed board g to this printed board g.

Then, a coating material i is coated on the outer surfaces of the electronic parts a and the printed board g by known means, thereby making the printed circuit board m waterproof and dampproof.

According to this conventional printed circuit board m, however, the coating material is not easily coated on the free end portions of the leads f protruding from the soldered portions and on the soldered portions themselves, and the coating layer, if the coating is successful, will not be thick enough so that those portions are likely to be exposed through the coating layer i. Water w may stick on any exposed portion due to dew condensation, causing a leak (see FIG. 14).

Figure 22:
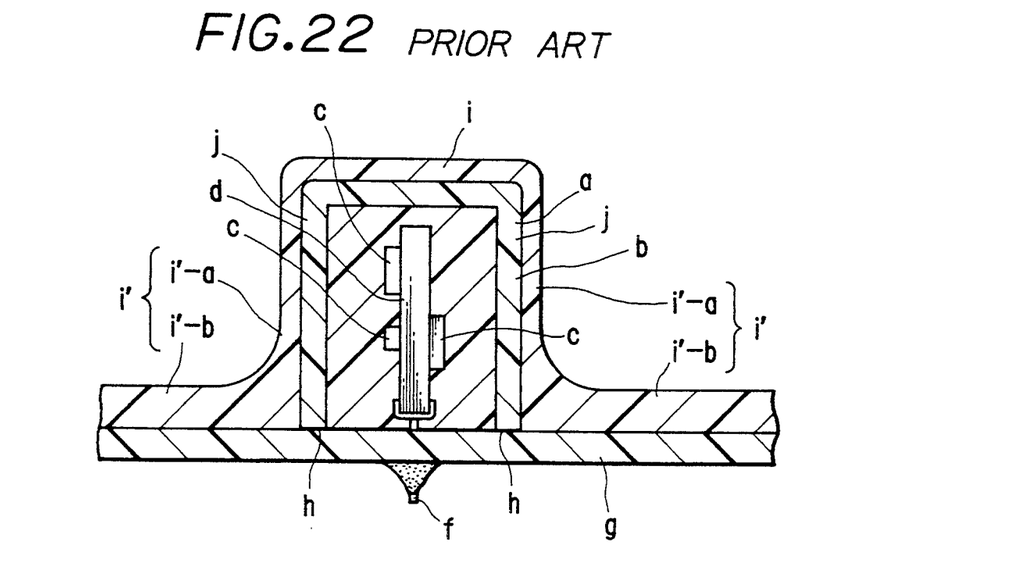
Figure 23:
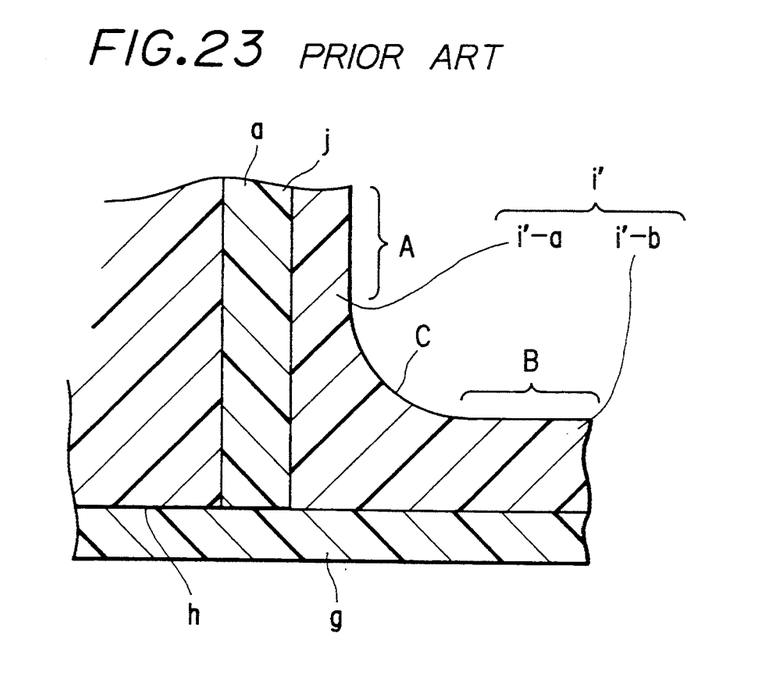
FIG. 23 is an enlarged cross-sectional view showing a part of the conventional electronic part.

FIGS. 22 and 23 illustrate a conventional electronic part mounted on a printed board, the electronic part and the printed board coated with a coating material.

Referring to those diagrams, an electronic part a comprises a case body b of a rectangular parallelopiped with one side open, a hybrid IC d, which has predetermined electronic elements c formed on a ceramic substrate or a glass substrate and is retained in the case body b, and a resin material e, which is injected into the case body b to bury the hybrid IC d.

In these diagrams, leads (only one shown) denoted by "f" extend from the hybrid IC d and protrude out of the case body b.

After this electronic part a is mounted on a printed board g with its mount surface h contacting this printed board g, the electronic part a and printed board g are coated with a thermoplastic coating material i.

According to the conventional electronic part a, however, the side walls of the case body b stand nearly perpendicular to the printed board g at the peripheral portion of that area where the case body b contacts the printed board g. Before the coating material i, coated on the electronic part a, becomes hardened, the coating material i may move downward and become hardened. If this happens, a relatively thin coating layer i'-a (portion A in FIG. 23) is formed on the side walls j of the case body b and a relatively thick coating layer i'-b (portion B in FIG. 23) is formed on the printed board g. In addition, the thickness of the coating layer drastically changes at the boundary between those coating layers i'-a and i'-b of different thicknesses (portion C in FIG. 23).

If there is a sharp change in the thickness of the coating layer i', stress would be concentrated on that portion C due to thermal contraction after the coating material i is hardened, causing a crack there. In addition, moisture will enter through the crack in the coating layer i', which may result in the malfunction of the circuit.

SUMMARY OF THE INVENTION

It is therefore a primary object of the present invention to provide a novel and improved printed circuit board with electronic parts mounted on a printed board, with their leads and soldered portions being buried in a coating material to thereby prevent the occurrence of a leak between the leads and the solder lands.

It is another object of this invention to provide a novel and improved electronic part which is to be mounted on a printed board and is designed to suppress the occurrence of cracks in a coating layer formed by coating the electronic pan and a printed board with a coating material after the electronic part is mounted on the printed board.

To achieve the first object, there is provided a printed circuit board comprising a printed board having a predetermined circuit pattern formed thereon; electronic parts with leads, mounted on the printed board; a frame surrounding all or a part of a soldering surface of the printed board, the amount of protrusion of the frame from the soldering surface of the printed board being made larger than that of protrusion of the leads of the electronic parts from the soldering surface side of the printed board; and a coating material filling space within the frame to bury the leads and soldered portions of the electronic parts.

As the leads of the electronic parts and the soldered portions of the printed board are buried in a coating material in this structure, the soldered portions or those of the leads which protrude from the soldered portions will not be exposed. Therefore, no moisture will stick on the soldered portions and/or those of the leads which protrude from the soldered portions due to dew condensation, thus preventing the occurrence of a leak.

According to a preferred modification of this printed circuit board, the coating material filling the space in the frame is different from a coating material coated on the outer surfaces of the frame and the electronic parts. It is preferable that the coating material filling the space in the frame have lower viscosity and lower hardness than the coating material coated on the outer surfaces of the frame and electronic parts.

The frame may be provided at the peripheral edge of the printed board so as to surround both the mount surface and soldering surface of the printed board.

To achieve the second object, there is provided an electronic part to be mounted on a printed board, comprising a case body having side walls and one side open; electronic elements sealed in the case body; a resin material injected into said case body to bury said electronic elements; and a plurality of leads protruding from the case body, the electronic part having a mount surface at which the electronic part is to be attached to the printed board when mounted thereon, mount-surface side outer peripheral portions of the side walls of the case body which are nearly perpendicular to the mount surface being formed in such a way that the closer to the mount surface the outer peripheral portions are, the further outward the outer peripheral portions extend.

With this structure, the thickness of a coating layer at the boundary between a coating layer on the printed board and a coating layer on the electronic part can be changed gradually. No stress will be concentrated on the boundary portion due to thermal contraction at the time the coating material is hardened, thus preventing cracks from occurring in the coating layer at the boundary portion.

The electronic elements are formed on a ceramic substrate or a glass substrate to constitute a single hybrid IC.

Two hybrid ICs may be sealed in the case body. In this case, two engage grooves running parallel to each other are formed in the inner wall of the case body opposite to the open side thereof in such a way that one side edge of each of the hybrid integrated circuits is to be engaged in the associated one of the engage grooves when housed in the case body.

BRIEF DESCRIPTION OF THE DRAWINGS

FIGS. 1 through 6 illustrate a printed circuit board according to one embodiment of the present invention.

FIGS. 7 through 11 illustrate a printed circuit board according to another embodiment of the present invention.

FIGS. 15 through 19 illustrate procedures of manufacturing and mounting an electronic part according to this invention;

FIGS. 22 and 23 exemplify a conventional electronic part, FIG. 22 being a cross-sectional view while

DETAILED DESCRIPTION OF THE PREFERRED EMBODIMENTS

Printed circuit boards according to preferred embodiments of the present invention will now be described in detail referring to the accompanying drawings.

FIGS. 1 through 4 illustrate a printed circuit board according to the first embodiment of the present invention.

In the diagrams, a printed circuit board 1 comprises a printed board 2 having a predetermined circuit pattern formed thereon, and electronic parts 3 mounted on the printed board 2.

Figure 1:
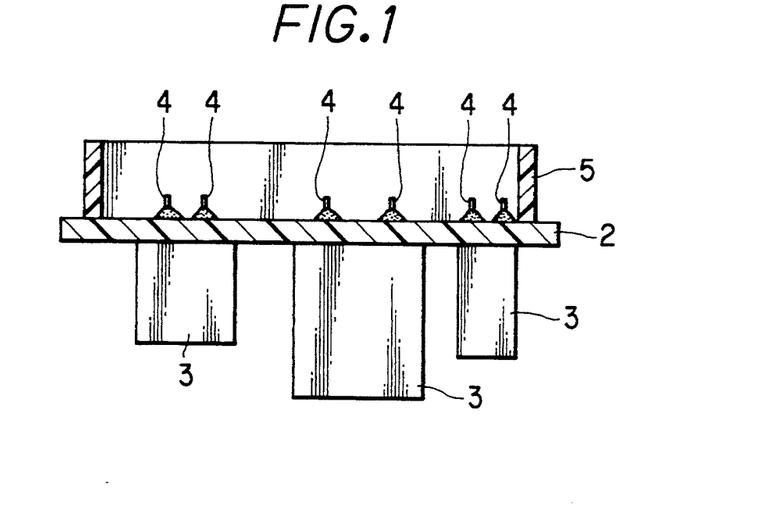
FIG. 1 is a cross-sectional view showing a frame attached to a printed board on which electronic parts have already been mounted.
Figure 2:
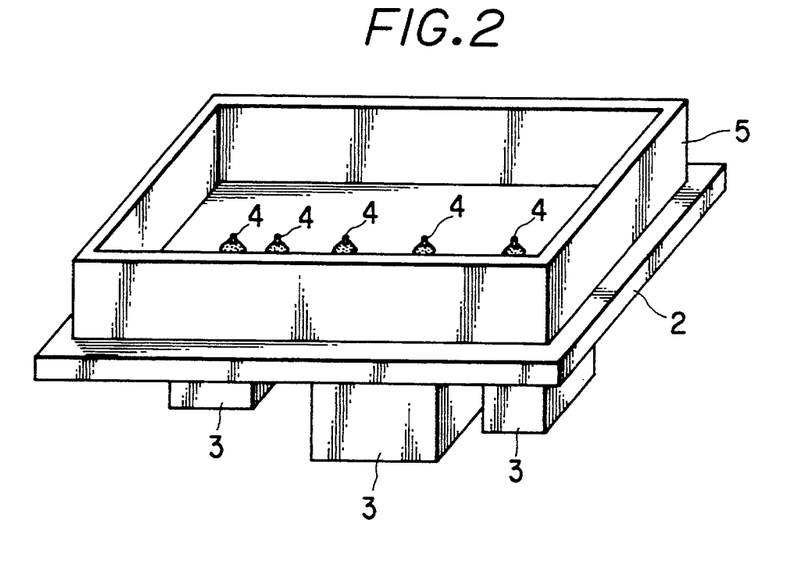
FIG. 2 is a perspective view showing the frame attached to the printed board on which electronic parts have already been mounted.
Figure 3:
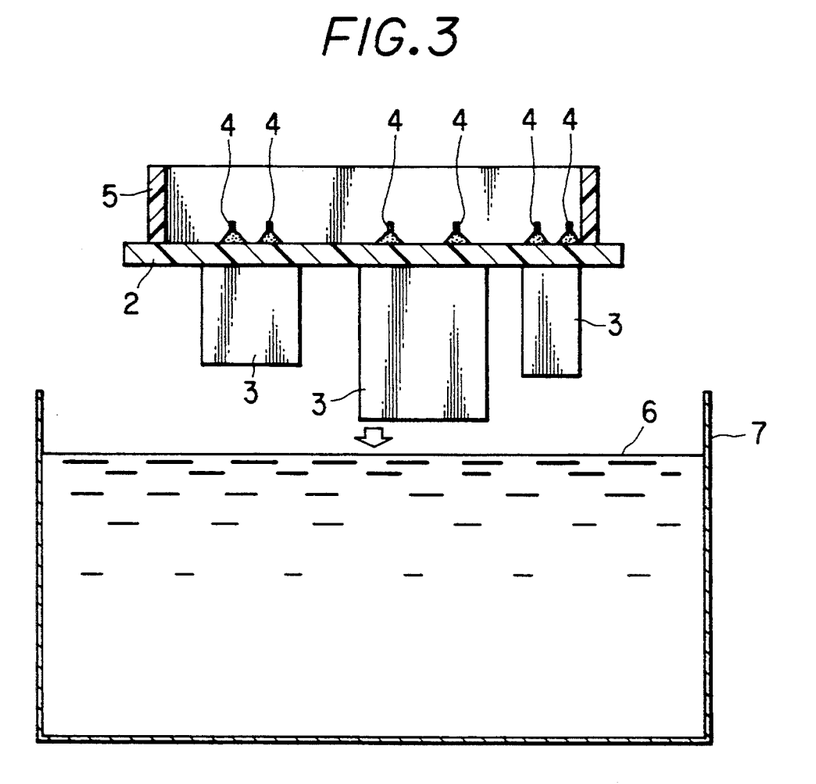
FIG. 3 is a cross-sectional view showing a process of coating this printed circuit board and illustrating that the frame and the printed board having electronic part mounted thereon are to be dipped in a tank of a coating material.

The printed board 2 has land holes (not shown) formed therein. The electronic parts 3 each have leads 4 which are inserted in the land holes and those portions of the leads 4 which come out of the soldering-surface side of the printed board 2 are soldered to the printed board 2, thus accomplishing the mounting of the electronic parts 3 on the printed board 2.

A frame 5 has a shape large enough to surround a portion slightly smaller than the whole plane of the printed board 2. The frame 5 has a height (length in the direction perpendicular to the plane of the printed board 2) which is greater than the amount of the protrusion of that of the leads of the electronic parts 3 which protrudes most from the printed board 2.

The portion slightly smaller than the whole plane of the printed board 2 includes that area of the soldering surface of the printed board 2 which includes all the portions where the leads 4 protrude. When the frame 5 is attached to the printed board 2, the leads 4 of the individual electronic parts 3 are located within the frame 5.

The frame 5 may be attached to the printed board 2 by screws directly or through L-shaped brackets (not shown). The frame 5 may also be attached to the printed board 2 by an adhesive.

Then, a coating material 6 is filled in the frame 5, and the surfaces of the printed board 2 and the electronic parts 3 are coated with the coating material 6. The filling and coating of the coating material 6 are executed as follows. The printed board 2 and the electronic parts 3 are dipped, with the electronic parts 3 facing downward, in a tank 7 filled with the coating material 6 (see FIG. 3) to put the coating material 6 inside the frame 5 as well as on the outer surfaces of the printed board 2, electronic parts 3 and frame 5. The resultant structure is then removed from the tank 7 (see FIG. 4).

Figure 4:
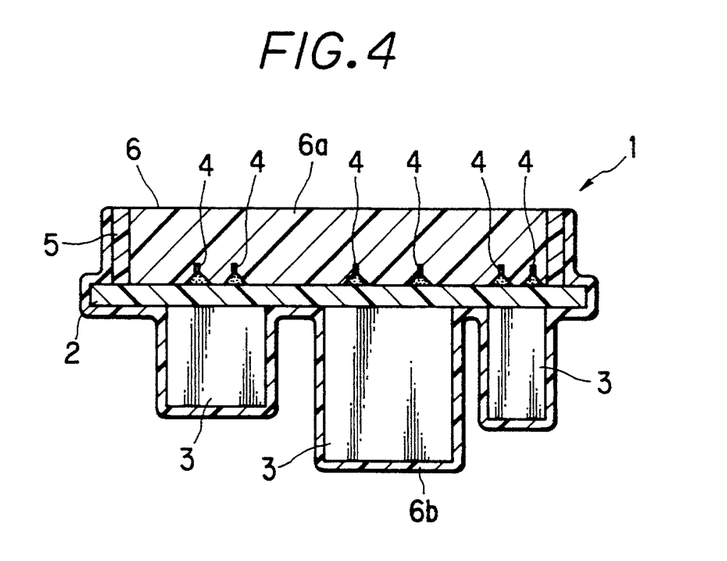
FIG. 4 is a cross-sectional view also showing the process of coating this printed circuit board, illustrating the printed circuit board removed from the tank.

The amount of protrusion of the leads 4 of the electronic parts 3 from the printed board 2 is smaller than the height of the frame 5. When the frame 5 is filled with the coating material 6, therefore, the leads 4 protruding from the printed board 2 are buried in a coating layer 6a and a coating layer 6b is formed on the outer surfaces of the printed board 2, electronic parts 3 and frame 5.

Figure 5:
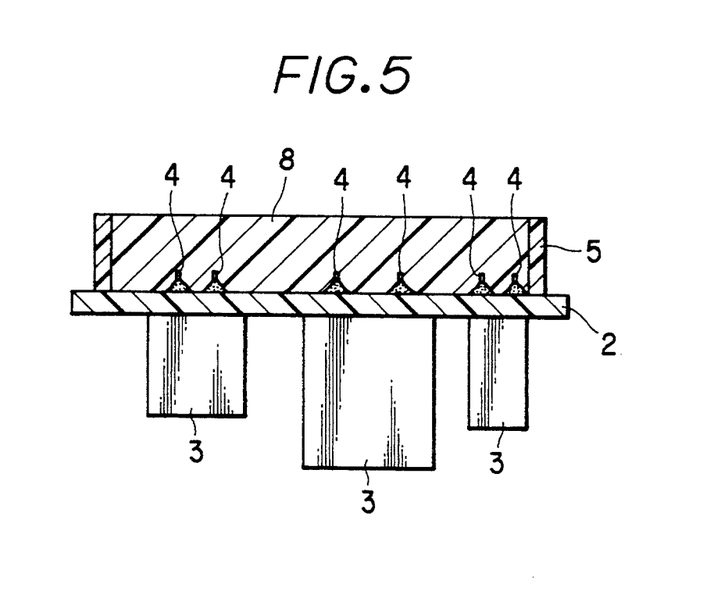
FIG. 5 is a cross-sectional view of a modification of the printed circuit board, showing a process of coating this printed circuit board with the frame filled up with a coating material.
Figure 6:
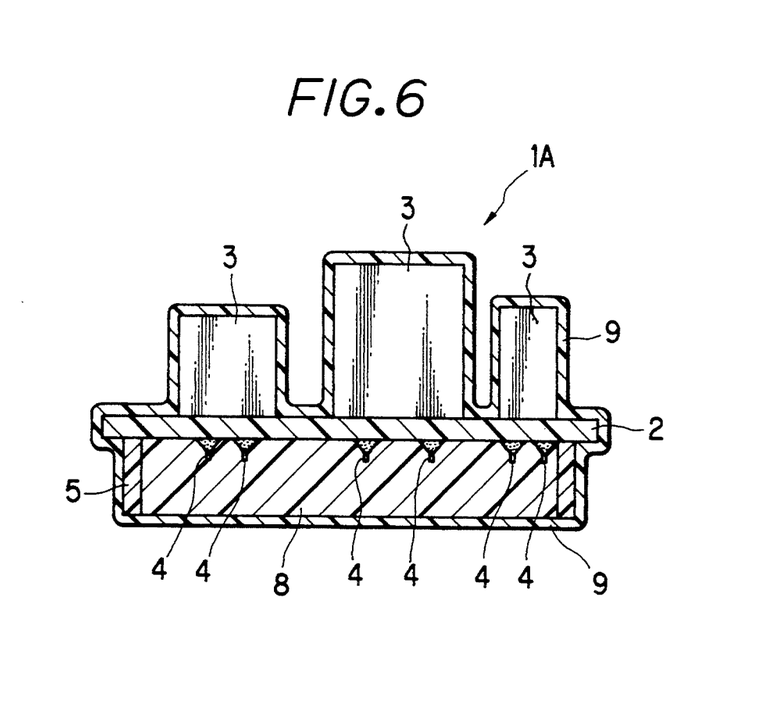
FIG. 6 is a cross-sectional view also showing the process of coating the printed circuit board in FIG. 5, illustrating coating made on the frame and the printed board having electronic parts mounted thereon.

FIGS. 5 and 6 illustrate a modification 1A of the printed circuit board.

According to the printed circuit board 1A of this modification, the coating material that is filled in the frame 5 on the printed circuit board I is made different from a coating material that is coated on the outer surfaces of the printed board 2, electronic parts 3 and frame 5.

A coating material 8 that is filled in the frame 5 has lower viscosity and lower hardness than a coating material 9 that is coated on the outer surfaces of the printed board 2, electronic parts 3 and frame 5 for the following reasons.

The coating material 8 in the frame 5 covers the soldered portions formed in the soldering surface of the printed board 2. If a high viscosity coating material is used for this purpose, stress would be produced when the volume of the coating material changes due to the influence of the ambient temperature. This stress may cause cracks at the soldered portions. The coating material 9, which is coated on the outer surfaces of the printed board 2, electronic parts 3 and frame 5, should cover the electronic parts, etc. with an enough thickness to provide waterproof and dampproof. The coating material 9 therefore needs to have certain degrees of viscosity and hardness.

Such coating materials of different properties may respectively be filled in the frame 5 and coated on the printed board 2, electronic parts 3 and frame 5 in the following manner to yield the printed circuit board 1A.

First, with the electronic parts 3 facing downward, the coating material 8 (low viscosity and low hardness) is injected into the frame 5 (see FIG. 5).

After the coating material 8 is hardened, the resultant structure is dipped in a tank (not shown) filled with the coating material 9 to coat the coating material 9 on the surfaces of the frame 5, printed board 2 and electronic parts 3. The resultant structure is then removed from the tank (see FIG. 6).

The thus formed printed circuit board 1A has the coating material 8 of low viscosity and low hardness filled in the frame 5 to cover the leads 4 of the electronic parts 3 and the soldered portions, and has the coating material 9 of a relatively high hardness covering the whole outer surface of the printed circuit board 1A.

FIGS. 7 through 11 illustrate a printed circuit board 1B according to the second embodiment of this invention.

The printed circuit board 1B of the second embodiment differs from the printed circuit board 1 of the first embodiment only in that the frame is provided at the outer peripheral edge of the printed board so as to surround the mount surface and soldering surface of the printed board.

Accordingly, only the difference will be discussed below and like or same reference numerals as used for the printed circuit board 1 are given to corresponding or identical portions in FIGS. 7 to 11 to avoid repeating their description.

Figure 7:
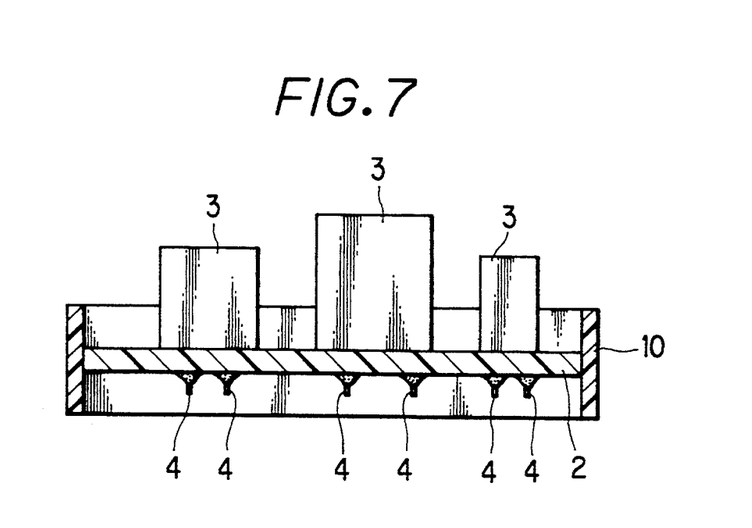
FIG. 7 is a cross-sectional view showing a frame attached to a printed board on which electronic parts have already been mounted.
Figure 8:
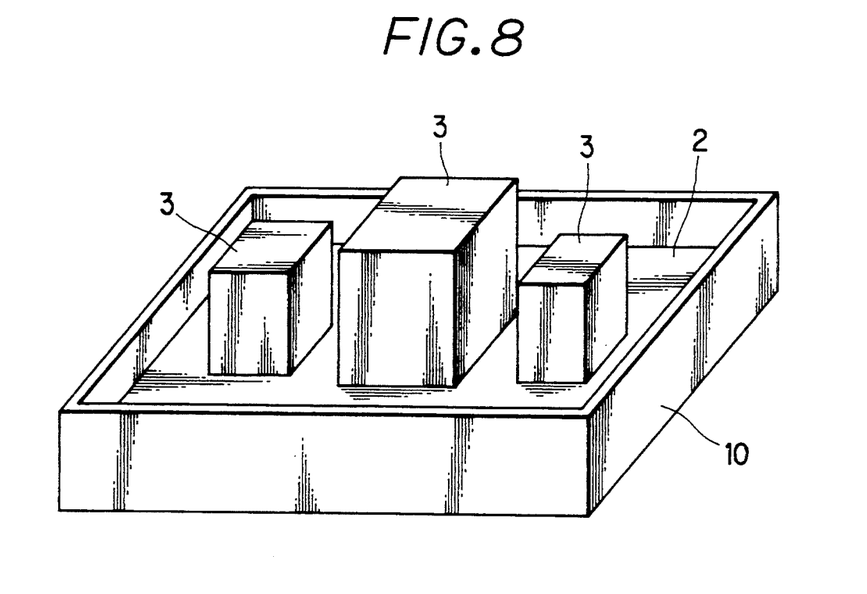
FIG. 8 is a perspective view showing the frame attached to the printed board on which electronic parts have already been mounted.

A frame 10 is attached to the outer peripheral edge of the printed board 2, nearly perpendicular to this printed board 2, and surrounds both the top and bottom sides of the printed board 2.

The frame 10 may be attached to the printed board 2 by screws directly or through L-shaped brackets (not shown). The frame 10 may also be adhered to the printed board 2 by an adhesive.

The frame 10, attached to the printed board 2 to surround it, is shaped in such a way that the amount of protrusion of the frame 10 from the printed board 2 on the soldering-surface side is made greater than the amount of protrusion of that one of the leads 4 of the electronic parts 3 which protrudes most from the printed board 2, while the amount of protrusion of the frame 10 from the printed board 2 on the mount-surface side is made slightly greater than the length of the lower end portions of the electronic parts 3.

Figure 9:
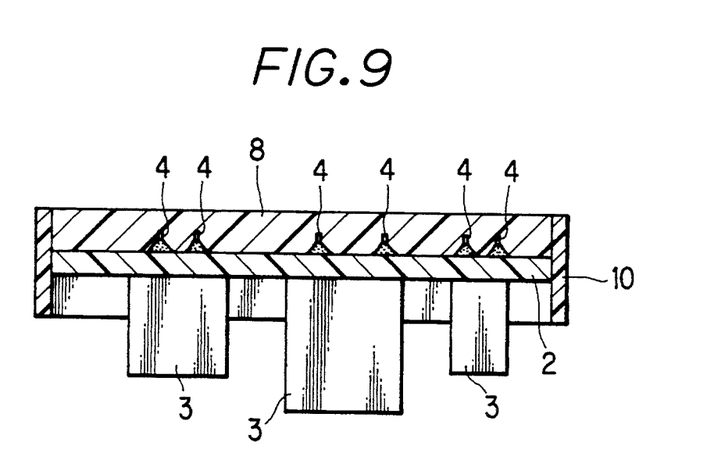
FIG. 9 is a cross-sectional view showing a process of coating this printed circuit board and illustrating a coating material filling the space in the frame on the soldering surface side of the printed board having electronic parts mounted thereon.
Figure 10:
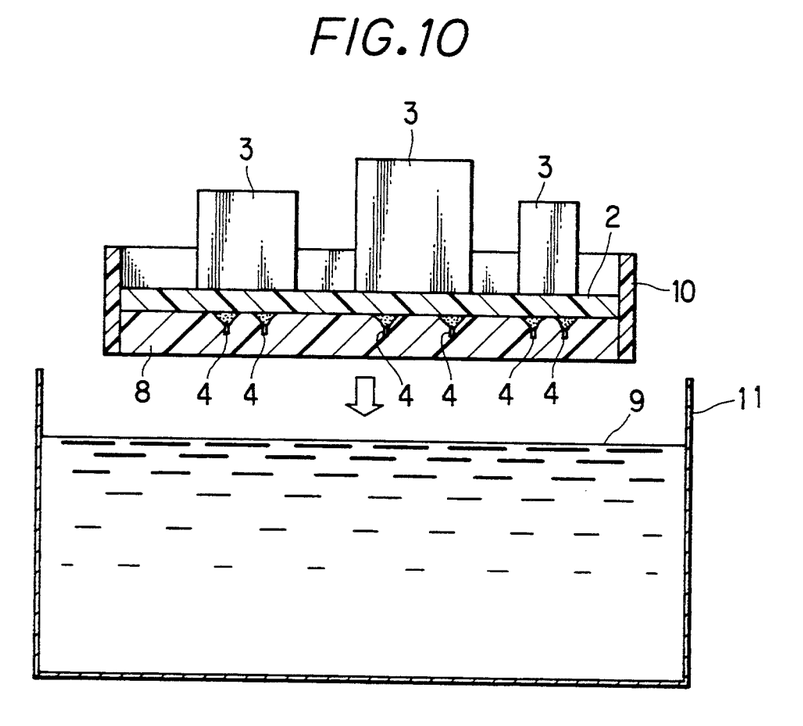
FIG. 10 is a cross-sectional view also showing the process of coating this printed circuit board and illustrating that the frame and the printed board having electronic parts mounted thereon in the state shown in FIG. 9 are to be dipped in a tank of a coating material.
Figure 11:
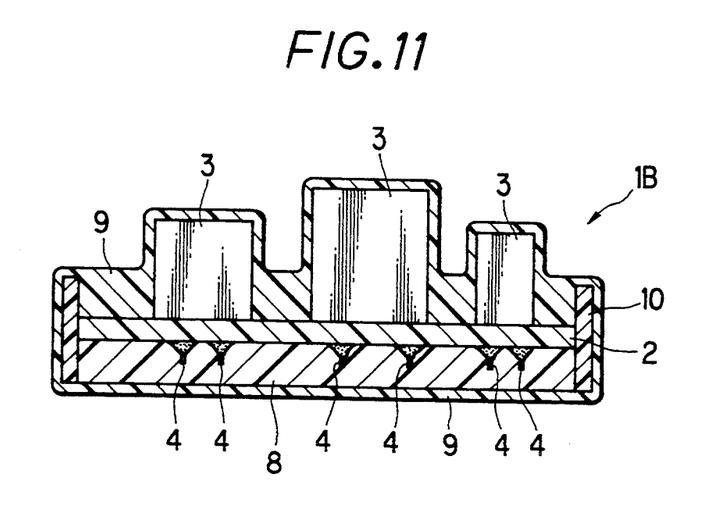
FIG. 11 is a cross-sectional view showing the process of coating this printed circuit board, illustrating the printed circuit board removed from the tank.

The filling of the coating material in the frame 10 inside which the printed board 2 is attached, and the coating of the coating material on the outer surface of the printed circuit board may be executed as follows.

First, with the electronic parts 3 facing downward, the coating material 8 (low viscosity and low hardness) is injected into the frame 10 on the soldering-surface side of the printed board 2 (see FIG. 9).

After the coating material 8 is hardened, the resultant structure with the electronic parts 3 facing upward is dipped in a tank 11 filled with the coating material 9 (see FIG. 10) to coat the coating material 9 on the surfaces of the frame 10, printed board 2 and electronic parts 3. The resultant structure is then removed from the tank 11 (see FIG. 11).

The thus formed printed circuit board 1B has the coating material 8 of low viscosity and low hardness filled in the frame 10 to cover the leads 4 of the electronic parts 3 and the soldered portions, and has the coating material 9 of a relatively high hardness covering the whole outer surface of the printed circuit board 1B.

Further, as a relative thick coating layer is formed on the mount surface of the printed board 2 to bury the lower end portions of the individual electronic parts 3, those electronic parts 3 will not move even vibration is applied to the printed circuit board 1B. The electronic parts 3 are therefore supported stably, thus preventing the electronic parts 3 from being broken or damaged and preventing the occurrence of the electric disconnection due to cracks at the soldered portions.

In short, the printed circuit board embodying the present invention comprises a printed board having a predetermined circuit pattern formed thereon; electronic parts with leads, mounted on the printed board; a frame surrounding all or a part of a soldering surface of the printed board, the amount of protrusion of the frame from the soldering surface of the printed board being made larger than that of protrusion of the leads of the electronic parts from the soldering surface side of the printed board; and a coating material filling space within the frame to bury the leads and soldered portions of the electronic parts. As the leads of the electronic parts and the soldered portions of the printed board are buried in a coating material in this printed circuit board, the soldered portions or those of the leads which protrude from the soldered portions will not be exposed. Therefore, no moisture will stick on the soldered portions and/or those of the leads which protrude from the soldered portions due to dew condensation, thus preventing the occurrence of a leak.

The coating material is filled in the space enclosing the mount surface and soldering surface of the printed board or coated on those surfaces in the above embodiments, but the present invention is not limited to this filling or coating manner. This invention can also be applied to a printed circuit board which puts a coating material only on the soldering surface to bury the leads of the electronic parts.

An electronic part 3 according to one embodiment of this invention will now be described referring to FIGS. 15 through 21. Like or same reference numerals as used to denote the components of the above-described printed circuit boards will be used in those diagrams to specify corresponding or identical components. The electronic part 3 comprises a case body 3-2 of a nearly rectangular parallelopiped with one side open, a hybrid IC 3-4 and a resin material 3-5 injected into the case body 3-2 to bury the hybrid IC 3-4. The hybrid IC 3-4 has predetermine electronic elements 3-3 formed on a ceramic substrate or a glass substrate. That surface of the electronic part 3 which lies on the open side of the case body 3-2 serves as a mount surface 3a. The case body 3-2 is so shaped that those end portions of the outer surface portions of its side walls 3-2a (only two shown) perpendicular to the mount surface 3a of the electronic part 3 which are located on the mount surface 3a have curved surfaces 3-2b that extend outward as the outer surface portions approach the mount surface.

Figure 18:
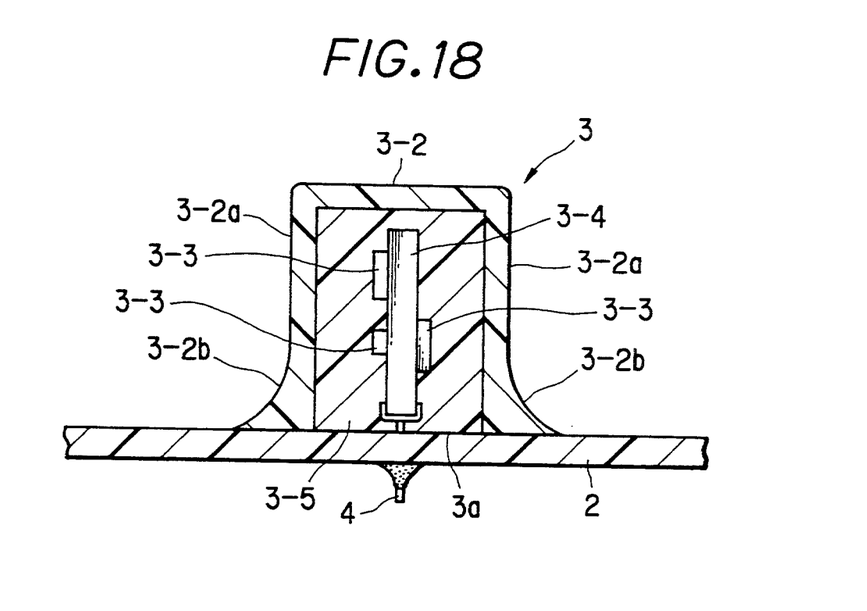
FIG. 18 is a cross-sectional view showing the electronic part mounted on a printed board.

Leads 4 (only one shown) extend from the hybrid IC 3-4 and come out of the mount surface 3a of the electronic part 3. After an adhesive is applied to the mount surface 3a of this electronic part 3, the leads 4 are inserted into the land holes (not shown) formed in a printed board 2 to adhere the mount surface 3a to the printed board 2.

Then, those portions of the leads 4 which protrude from the opposite side of the printed board 2 to the mount surface 3a are soldered to the printed board 2, thus accomplishing the mounting of the electronic part 3 on the printed board 2 (see FIG. 18).

Figure 19:
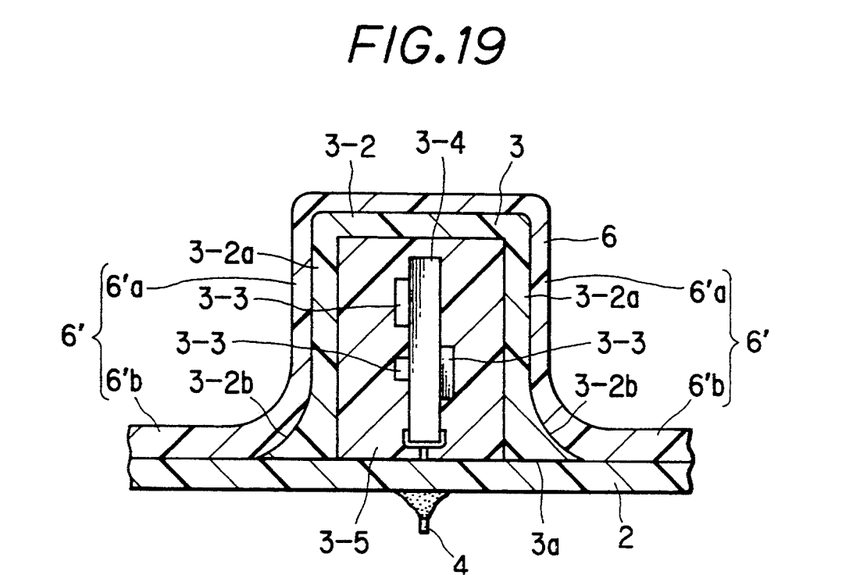
FIG. 19 is a cross-sectional view illustrating the electronic part and printed board coated with a coating material.

The electronic part 3 and the printed board 2 with the electronic part 3 mounted thereon are coated with a thermoplastic coating material 6 (see FIG. 19).

Figure 20:
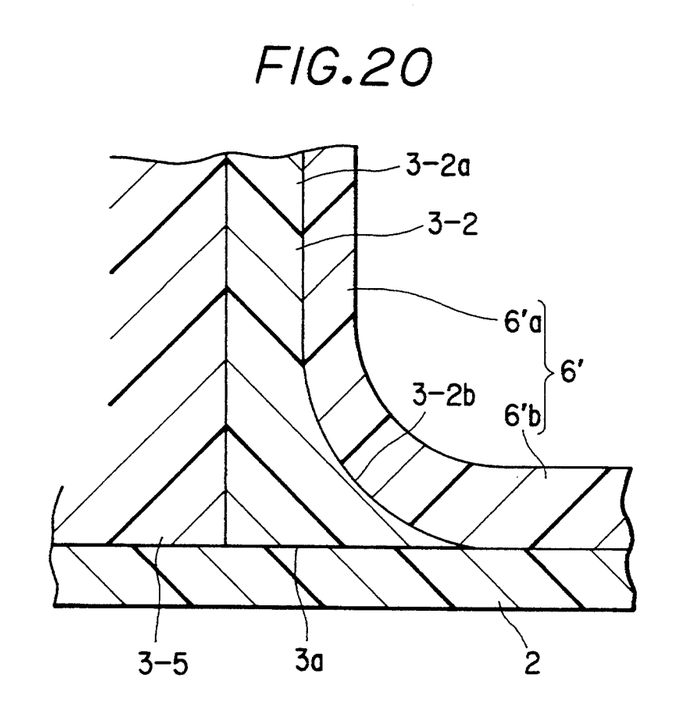
FIG. 20 is an enlarged cross-sectional view of the essential portion.

The coating material 6 is coated thin on the side walls 3-2a of the case body 3-2, forming a thin coating layer 6'a thereon, and is coated thick on the printed board 2, forming a thick coating layer 6'b thereon. Those thin and thick coating layers 6'a and 6'b are formed in such a way that the thickness of the coating layer at the boundary between the thin coating layer 6'a and the thick coating layer 6'b changes gradually by the curved surfaces 3-2b.

When the coating material 6 on the electronic pan 3 and printed board 2 is hardened to become the coating layer 6', there is no portion where the layer thickness drastically changes, thus causing no concentration of stress on the boundary portion due to thermal contraction.

Figure 21:
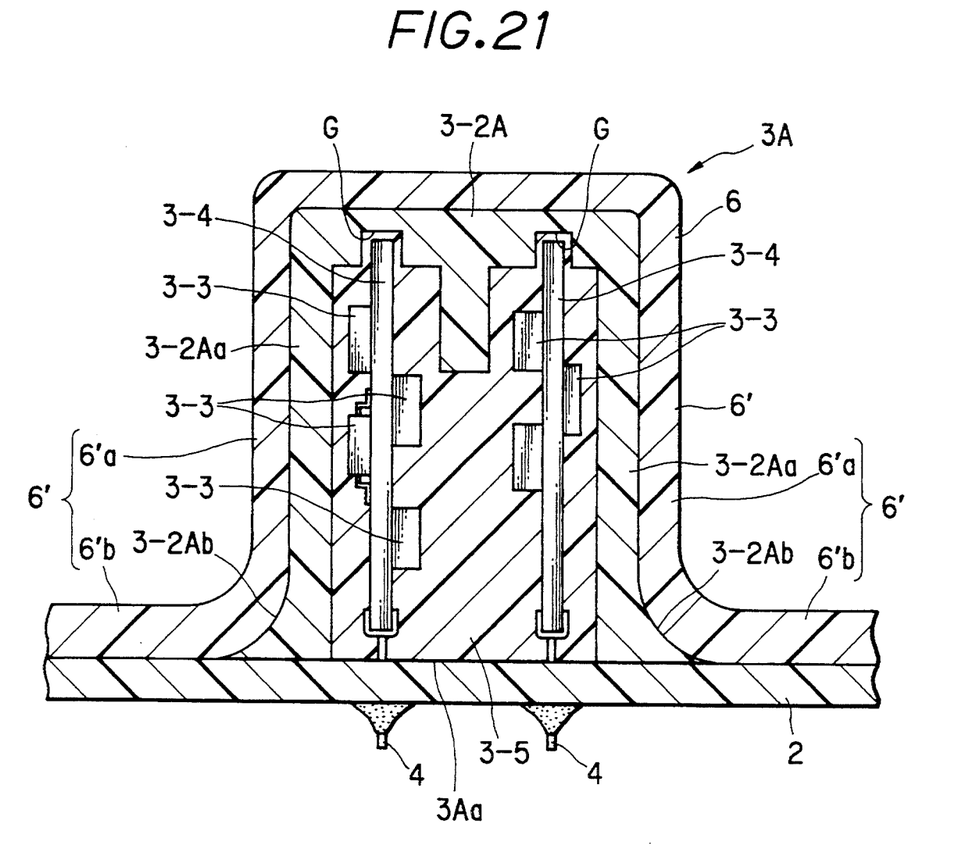
FIG. 21 is a cross-sectional view showing a modification of the electronic part.

This invention may also be applied to an electronic part 3 A which has two hybrid ICs 3-4 retained in the case body as shown in FIG. 21.

The case body 3-2A is a rectangular parallelopiped with one side open, and has space large enough to dispose the two hybrid ICs 3-4 side by side without touching each other.

Engage grooves G are formed in parallel in the inner wall of the closed wall of the case body 3-2A opposite to the open side. One side edge of the substrate of each hybrid IC 3-4 is to be engaged with the associated one of the engage grooves G.

The hybrid ICs 3-4 are housed in the case body 3-2A, with the one side edges of those substrates engaged with the respective engage grooves G, and a resin material 3-5 is then injected into the case body 3-2A, thus providing the electronic pan 3 A.

The case body 3-2A, like the case body 3-2 of the above-described electronic part 3, is so shaped that those end portions of the outer surface portions of its side walls 3-2Aa (only two shown) perpendicular to the mount surface 3Aa of the electronic part 3A which are located on the mount surface 3Aa have curved surfaces 3-2Ab that extend outward as the outer surface portions approach the mount surface.

According to the electronic part 3A also, when this electronic part 3A is mounted on the printed board 2 and the resultant structure is coated with the coating material 6, the thin coating layer 6'a is formed on the side walls 3-2Aa of the case body 3-2A, while the thick coating layer 6'b is formed on the printed board 2. The thin and thick coating layers 6'a and 6'b, like those of the electronic part 3, are formed in such a way that the thickness of the coating layer at the boundary between the thin coating layer 6'a and the thick coating layer 6'b changes gradually by the curved surfaces 3-2Ab. Therefore, there is no portion where the layer thickness drastically changes, thus causing no concentration of stress on the boundary portion due to thermal contraction.

In short, the present invention can provide an electronic part to be mounted on a printed board, which comprises a case body having side walls and one side open; electronic elements sealed in the case body; a resin material injected into said case body to bury said electronic elements; and a plurality of leads protruding from the case body, the electronic part having a mount surface at which the electronic part is to be attached to the printed board when mounted thereon, mount-surface side outer peripheral portions of the side walls of the case body which are nearly perpendicular to the mount surface being formed in such a way that the closer to the mount surface the outer peripheral portions are, the further outward the outer peripheral portions extend.

With this structure, the thickness of a coating layer at the boundary between a coating layer on the printed board and a coating layer on the electronic part can be changed gradually. No stress will be concentrated on the boundary portion due to thermal contraction at the time the coating material is hardened, thus preventing cracks from occurring in the coating layer at the boundary portion.

Although the outer peripheral portions of the side walls of the case body on the mount surface are curved in the above embodiment, they are not limited to the curved shapes but may have tapered shapes.

The case body has one side open, but the case body is not limited to this particular shape. For instance, the open side may be closed. The case body is not limited to a rectangular parallelopiped, but may have a cylinder shape.

The structures or shapes of the individual portions or members of the printed circuit boards and electronic parts according to those embodiments and their quantities given in the foregoing description are to be considered as illustrative and not restrictive and the invention is not to be limited to the details given herein, but may be modified within the scope of the appended claims.

What is claimed is:

1. A printed circuit board comprising:
   a printed board having a predetermined circuit pattern formed thereon;
   electronic parts with leads, mounted on said printed board;
   a frame surrounding all or a part of a soldering surface of said printed board and protruding therefrom, the amount of protrusion of said frame from said soldering surface of said printed board being made larger than that of protrusion of said leads of said electronic parts from said soldering surface side of said printed board; and
   a coating material filling space within said frame to bury said leads and soldered portions of said electronic parts.

2. The printed circuit board according to claim 1, wherein said frame is provided at a peripheral edge of said printed board so as to surround both a mount surface of said printed board and said soldering surface thereof.

3. The printed circuit board according to claim 1, wherein said frame is attached to said printed board by means of screws.

4. The printed circuit board according to claim 1, wherein said frame is attached to said printed board by an adhesive.

5. The printed circuit board according to claim 3, wherein said frame is attached to said printed board directly by said screws.

6. The printed circuit board according to claim 3, wherein said frame is fastened to said printed board via L-shaped brackets by said screws.

7. The printed circuit board according to any one of claims 1, wherein said coating material filling said space in said frame is different from a coating material coated on outer surfaces of said frame and said electronic parts.

8. The printed circuit board according to claim 7, wherein said coating material filling said space in said frame has lower viscosity and lower hardness than said coating material coated on said outer surfaces of said frame and electronic parts.

* * * * *